US010553622B2

(12) United States Patent
Lee et al.

(10) Patent No.: US 10,553,622 B2
(45) Date of Patent: Feb. 4, 2020

(54) DISPLAY APPARATUS AND METHOD OF MANUFACTURING THE SAME

(71) Applicant: Samsung Display Co., Ltd., Yongin-si (KR)

(72) Inventors: Hyeonbum Lee, Hwaseong-si (KR); Hyoeng-Ki Kim, Suwon-si (KR); Dongki Lee, Seongnam-si (KR); Kyoung-Heon Lee, Cheonan-si (KR); Jin-Whan Jung, Yesan-gun (KR)

(73) Assignee: Samsung Display Co., Ltd., Yongin-si (KR)

( * ) Notice: Subject to any disclaimer, the term of this patent is extended or adjusted under 35 U.S.C. 154(b) by 11 days.

(21) Appl. No.: 15/460,205

(22) Filed: Mar. 15, 2017

(65) Prior Publication Data

US 2018/0240822 A1 Aug. 23, 2018

(30) Foreign Application Priority Data

Feb. 23, 2017 (KR) .................. 10-2017-0024294

(51) Int. Cl.
*H01L 27/12* (2006.01)
*H01L 27/32* (2006.01)

(52) U.S. Cl.
CPC ........ *H01L 27/1255* (2013.01); *H01L 27/124* (2013.01); *H01L 27/322* (2013.01); *H01L 27/3272* (2013.01)

(58) Field of Classification Search
CPC ......... G02F 1/133512; G02F 1/136209; H01L 27/3246; H01L 27/3272; H01L 27/1255; H01L 27/124; H01L 27/322; H01L 27/326

See application file for complete search history.

(56) References Cited

U.S. PATENT DOCUMENTS 6,420,834 B2 * 7/2002 Yamazaki ........... H01L 27/3246
313/238
7,177,136 B2 * 2/2007 Aoki ....................... H05K 3/00
174/252

(Continued)

FOREIGN PATENT DOCUMENTS

KR 10-0964225 6/2010
KR 10-2012-0122534 11/2012
(Continued)

OTHER PUBLICATIONS

Extended European Search Report dated May 28, 2018, in European Patent Application No. 18158415.2.

*Primary Examiner* — Latanya N Crawford
(74) *Attorney, Agent, or Firm* — H.C. Park & Associates, PLC

(57) ABSTRACT

A display apparatus includes a substrate, a patterned layer, a light-shielding layer, a first electrode, a second electrode, an electroluminescent layer (EL), a first insulating layer (FIL), and a color filter (CF). The patterned layer is disposed on the substrate, and includes: first body portions, and a first opening between the first body portions. The light-shielding layer is disposed on the patterned layer, and includes: second body portions, and a second opening between the second body portions. The first electrode is disposed on the substrate, the first and second openings overlap the first electrode. The second electrode overlaps the first electrode. The EL is disposed between the first and second electrodes. The FIL is disposed on the second electrode. The CF is disposed on the FIL. The EL is at least disposed in the first opening, and the FIL and the CF are at least disposed in the second opening.

20 Claims, 14 Drawing Sheets

(56) References Cited

U.S. PATENT DOCUMENTS

| | | | |
|---|---|---|---|
| 7,282,843 B2* | 10/2007 | Kiguchi | G02B 5/201 |
| | | | 313/110 |
| 8,253,322 B2 | 8/2012 | Lee | |
| 8,362,469 B2* | 1/2013 | Suh | H01L 27/3279 |
| | | | 257/40 |
| 8,860,299 B2 | 10/2014 | Seong | |
| 9,341,901 B2 | 5/2016 | Kanda et al. | |
| 9,716,250 B2* | 7/2017 | Kim | H01L 51/5271 |
| 2010/0171147 A1* | 7/2010 | Hayashi | H01L 51/5237 |
| | | | 257/100 |
| 2011/0031500 A1* | 2/2011 | Suh | H01L 27/3279 |
| | | | 257/59 |
| 2011/0075249 A1* | 3/2011 | Murakami | G02F 1/167 |
| | | | 359/296 |
| 2014/0291623 A1* | 10/2014 | Choi | H01L 27/3246 |
| | | | 257/40 |
| 2014/0353630 A1 | 12/2014 | Baek et al. | |
| 2015/0014636 A1* | 1/2015 | Kang | H01L 51/5253 |
| | | | 257/40 |
| 2015/0091030 A1* | 4/2015 | Lee | H01L 27/3246 |
| | | | 257/91 |
| 2015/0115234 A1* | 4/2015 | Hong | H01L 51/525 |
| | | | 257/40 |
| 2015/0371573 A1 | 12/2015 | Choi et al. | |
| 2016/0049450 A1* | 2/2016 | Kim | H01L 27/3246 |
| | | | 257/40 |
| 2016/0226030 A1 | 8/2016 | Heo | |
| 2016/0322444 A1 | 11/2016 | Kang et al. | |
| 2016/0372528 A1* | 12/2016 | Kamura | H01L 51/0096 |
| 2017/0125740 A1* | 5/2017 | Lee | H01L 27/322 |
| 2018/0033848 A1* | 2/2018 | Jung | H01L 51/56 |

FOREIGN PATENT DOCUMENTS

| | | |
|---|---|---|
| KR | 10-2014-0031004 | 3/2014 |
| KR | 10-2014-0137740 | 12/2014 |
| KR | 10-2016-0000096 | 1/2016 |
| KR | 10-2016-0008728 | 1/2016 |
| KR | 10-2016-0095300 | 8/2016 |

* cited by examiner

DISPLAY APPARATUS AND METHOD OF MANUFACTURING THE SAME

CROSS-REFERENCE TO RELATED APPLICATION

This application claims priority from and the benefit of Korean Patent Application No. 10-2017-0024294, filed on Feb. 23, 2017, which is hereby incorporated by reference for all purposes as if fully set forth herein.

BACKGROUND

Field

One or more exemplary embodiments relate to display technology, and, more particularly, to a display apparatus and a method of manufacturing the display apparatus.

Discussion

Organic and inorganic light-emitting display devices are self-luminous display devices capable of providing relatively wide viewing angles and high contrast ratios, as well as relatively fast response times. As such, self-luminous display devices attract attention in many different applications, such as televisions, media players, notebook computers, gaming devices, tablets, monitors, navigational aids, pendant devices, billboards, watches, headphones, earpieces, consumer appliances, etc. Conventional organic light-emitting display devices, in which a formative substance of a light emitting layer includes organic matter, additionally offer relatively high brightness, low driving voltage, and a wide color gamut.

Typically, a display device may include a light-shielding layer with openings (or apertures) through which light emitted from the light emitting layer is output. The light-shielding layer may prevent (or at least reduce) the light emitted from the light emitting layer from mixing with light from adjacent light emitting layers, as well as absorb light from an ambient environment. A conventional display device may also include color filters to modify a color of light emitted from the light emitting layer. A need, however, exists for efficient, cost-effective techniques to reduce the thickness of a display device, but provide sufficient light blocking, ambient light absorbing, and color tuning features.

The above information disclosed in this section is only for enhancement of an understanding of the background of the inventive concepts, and, therefore, it may contain information that does not form prior art already known to a person of ordinary skill in the art.

SUMMARY

One or more exemplary embodiments provide a display apparatus.

One or more exemplary embodiments provide a method of manufacturing a display apparatus.

Additional aspects will be set forth in the detailed description which follows, and, in part, will be apparent from the disclosure, or may be learned by practice of the inventive concepts.

According to one or more exemplary embodiments, a display apparatus includes a substrate, a patterned layer, a light-shielding layer, a first electrode, a second electrode, an electroluminescent layer, a first insulating layer, and a color filter. The patterned layer is disposed on the substrate. The patterned layer includes: first body portions, and a first opening disposed between the first body portions. The light-shielding layer is disposed on the patterned layer. The light-shielding layer includes: second body portions, and a second opening disposed between the second body portions. The first electrode is disposed on the substrate. The first opening and the second opening overlap the first electrode. The second electrode overlaps the first electrode. The electroluminescent layer is disposed between the first electrode and the second electrode. The first insulating layer is disposed on the second electrode. The color filter is disposed on the first insulating layer. The electroluminescent layer is at least disposed in the first opening. The first insulating layer and the color filter are at least disposed in the second opening.

According to one or more exemplary embodiments, a display apparatus includes a first electrode, a patterned layer, a light-shielding layer, an electroluminescent layer, a second electrode, and a color filter. The patterned layer includes a first aperture exposing a portion of the first electrode. The light-shielding layer is disposed on the patterned layer. The light-shielding layer includes a second aperture overlapping the first aperture. The electroluminescent layer is disposed in a portion of the first aperture. The second electrode is disposed in portions of the second aperture and the first aperture. The electroluminescent layer is stacked between the first electrode and the second electrode. The color filter extends into at least one of the second aperture and the first aperture. The second electrode overlaps the light-shielding layer, the patterned layer, and the electroluminescent layer.

According to one or more exemplary embodiments, a method of manufacturing a display apparatus includes: forming a patterned layer on a substrate including a first electrode, the patterned layer including a first aperture exposing a portion of the first electrode; forming a light-shielding layer on the patterned layer, the light-shielding layer including a second aperture overlapping the first aperture; depositing, through the second aperture, an electroluminescent material on the portion of first electrode; forming a second electrode on the electroluminescent material, the second electrode extending at least into the second aperture; and forming a color filter overlapping the electroluminescent material, the color filter extending at least into the second aperture.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
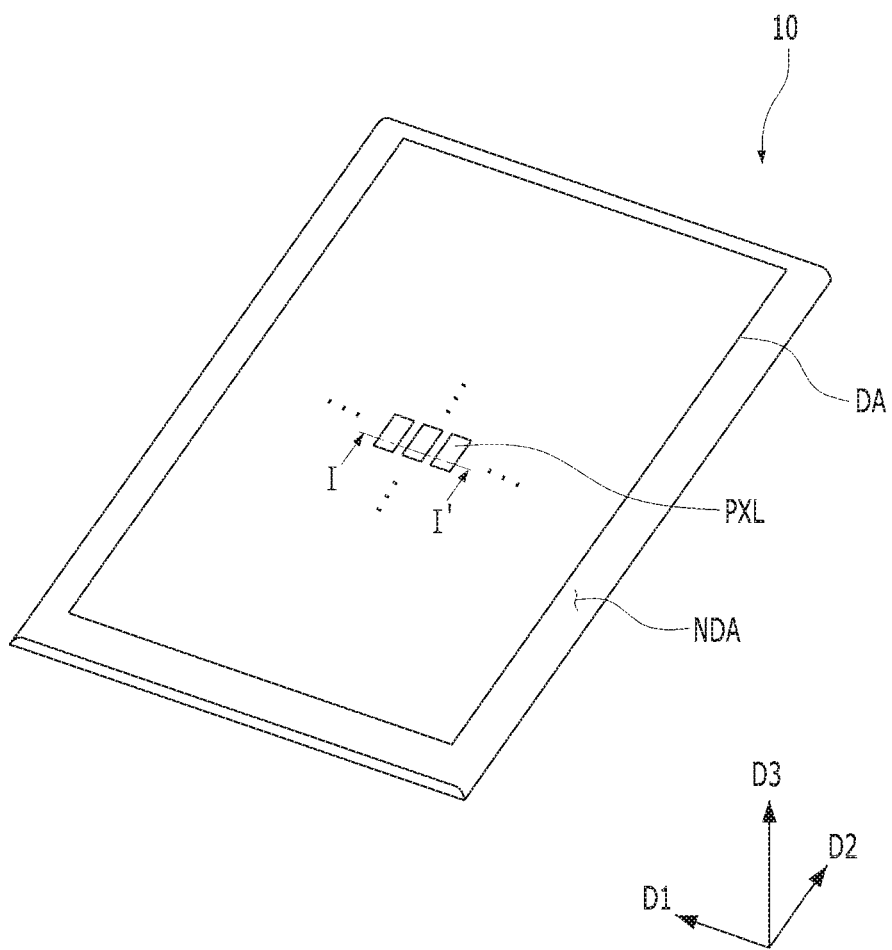
FIG. 1 is a perspective view of a display apparatus, according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, aspects, etc. (hereinafter collectively referred to as "elements"), of the various illustrations may be otherwise combined, separated, interchanged, and/or rearranged without departing from the disclosed exemplary embodiments.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying figures, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Further, the D1-axis, the D2-axis, and the D3-axis are not limited to three axes of a rectangular coordinate system, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the present disclosure.

Spatially relative terms, such as "beneath," "below," "under," "lower," "above," "upper," "over," and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings are schematic in nature and shapes of these regions may not illustrate the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Although various exemplary embodiments are described with respect to organic light emitting display devices, it is contemplated that various exemplary embodiments are also applicable to other types of display devices, such as liquid crystal display devices, inorganic electroluminescent display devices, field emission display devices, plasma display devices, electrophoretic display devices, electrowetting display devices, and the like.

FIG. 1 is a perspective view of a display apparatus, according to one or more exemplary embodiments.

Referring to FIG. 1, display apparatus 10 includes display area DA and non-display area NDA disposed outside of display area DA. In one or more exemplary embodiments, display apparatus 10 may be deformable, e.g., bendable, foldable, flexible, etc. It is contemplated, however, that display apparatus 10 may be rigid, or may include one or more rigid portions and one or more deformable portions. Display apparatus 10 may be a display panel.

Display area DA may correspond to an active area of display apparatus 10. The active area is a region in which a function of display apparatus 10 is provided to a user, such as a display function. Display area DA may be configured to display an image by combining light from pixels PXL included as part of display area DA. Pixels PXL may be arranged in any suitable formation, such as a matrix formation. For example, pixels PXL may be arranged in first direction D1 and second direction D2 that intersects first direction D1. In this manner, light may be emitted from display apparatus 10 in third direction D3 intersecting first direction D1 and second direction D2. It is noted that third direction D3 may be perpendicular to first direction D1 and second direction D2.

Non-display area NDA is disposed outside display area DA. Non-display area NDA may correspond to an inactive area of display apparatus 10. The inactive area is a region in which the function of display apparatus 10 is not provided. At least part of signal lines (not shown) and circuits (not illustrated) for operating pixels PXL may be disposed in non-display area NDA. In one or more exemplary embodiments, portions of the signal lines and the circuits may be covered with, for example, a light-blocking layer (not shown), such as a black matrix, that is disposed in non-display area NDA. It is noted that the light blocking layer may be disposed between pixels PXL of display area DA. In this manner, the light blocking layer may include apertures through which pixels PXL emit light.

Display apparatus 10 may further include a peripheral circuit (not shown) configured to drive pixels PXL of display area DA. The peripheral circuit may include any suitable component(s) for controlling pixels PXL, such as a gate driver, a data driver, and a power source. The peripheral circuit may receive an input image signal from a source (e.g., a source external to display apparatus 10) and control at least one of pixels PXL based on the input image signal. Signal lines (not illustrated) connecting pixels PXL to the peripheral circuit may pass through non-display area NDA and extend into display area DA. As such, pixels PXL may display an image based on signals received via the signal lines. An equivalent circuit of a representative pixel PXL is described in more detail in association with FIG. 2.

A cover window (not illustrated) may be provided on display apparatus 10. The cover window may cover, and, thereby, protect display apparatus 10 from (or reduce the extent of) external impacts, scratches, contaminants, etc. Display apparatus 10 may be coupled to the cover window via, for instance, a transparent adhesive layer; however, it is contemplated that any other suitable coupling mechanism may be utilized, e.g., chemical, mechanical, etc. It is also contemplated that the cover window may be formed as a portion (e.g., one or more layers) of display apparatus 10. Further, a touch screen (not shown) may be provided between display apparatus 10 and the cover window. It is also contemplated that the touch screen may be incorporated as a portion, e.g., one or more layers, of display apparatus 10.

Figure 2:
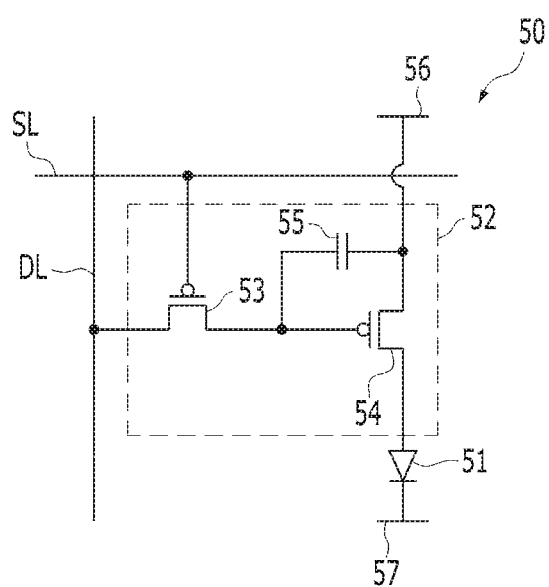
FIG. 2 is an equivalent circuit diagram of a pixel of the display apparatus of FIG. 1, according to one or more exemplary embodiments.

FIG. 2 is an equivalent circuit diagram of a pixel of the display apparatus of FIG. 1, according to one or more exemplary embodiments.

Referring to FIG. 2, pixel 50 may be representative of pixels PXL of display apparatus 10. Pixel 50 may include organic light-emitting diode (OLED) 51 and pixel circuit 52 for controlling OLED 51. Pixel circuit 52 may include switching transistor 53, driving transistor 54, and sustain capacitor 55. Although reference will be made to this implementation, it is also contemplated that pixel 50 may embody many forms and include multiple and/or alternative components and configurations. For instance, pixel 50 may include any suitable number of thin film transistors and any suitable number of capacitors. As such, the equivalent circuit diagram of FIG. 2 is merely illustrative; exemplary embodiments are not limited thereto or thereby.

Switching transistor 53 may include a gate electrode connected to scan line SL, a first electrode connected to data line DL, and a second electrode connected to a gate electrode of driving transistor 54. Scan line SL and data line DL may correspond to at least some of the above-noted signal lines, and, thereby, may be connected to a peripheral circuit, e.g., gate driver, data driver, etc. Switching transistor 53 may be turned on by a gate on voltage of a scan signal applied to scan line SL. A data voltage received via data line DL may be transmitted to the gate electrode of driving transistor 54 when switching transistor 53 is turned on.

Driving transistor 54 may include a gate electrode connected to the second electrode of switching transistor 53, a first electrode for receiving first power source voltage 56, and a second electrode connected to an anode of OLED 51. Driving transistor 54 may control a current flow to OLED 51 from first power source voltage 56 according to a data voltage applied to the gate electrode of driving transistor 54.

Sustain capacitor 55 may include a first electrode connected to the gate electrode of driving transistor 54 and the second electrode of switching transistor 53. Sustain capacitor 55 may include a second electrode for receiving first power source voltage 56. Sustain capacitor 55 may charge a data voltage received from driving transistor 54 and may maintain a charge when, for instance, switching transistor 53 is turned off.

OLED 51 may include an anode electrode connected to the second electrode of driving transistor 54 and a cathode electrode for receiving second power source voltage 57. In this manner, OLED 51 may emit light of any suitable color, e.g., a primary color. For example, OLED 51 may emit light having at least one of a red color, a green color, a blue color, a white color, etc. A desired image may be displayed on display apparatus 10 via a spatial or temporal sum of the output of pixels PXL.

Switching transistor 53 and driving transistor 54 may be p-channel field effect transistors. As such, the gate on voltage for turning on switching transistor 53 and driving transistor 54 may be a logic low level voltage and the gate off voltage for turning off the same may be a logic high level voltage. At least one of switching transistor 53 and driving transistor 54 may be an n-channel field effect transistor. As such, the gate on voltage for turning on the n-channel field effect transistor may be a logic high level voltage and the gate off voltage for turning the same off may be a logic low level voltage.

The peripheral circuit may apply the gate on voltage to scan line SL to turn on switching transistor 53. The peripheral circuit may apply the gate on voltage or the gate off voltage as a data voltage to data line DL. In a case where the peripheral circuit applies the gate on voltage, sustain capacitor 55 may be charged with a data voltage from data line DL through switching transistor 53. In addition, the data voltage from data line DL may turn on driving transistor 54. A current corresponding to the data voltage may flow to OLED 51 through turned-on driving transistor 54 from first power source voltage 56. In this manner, OLED 51 may emit light according to the current.

Figure 3:
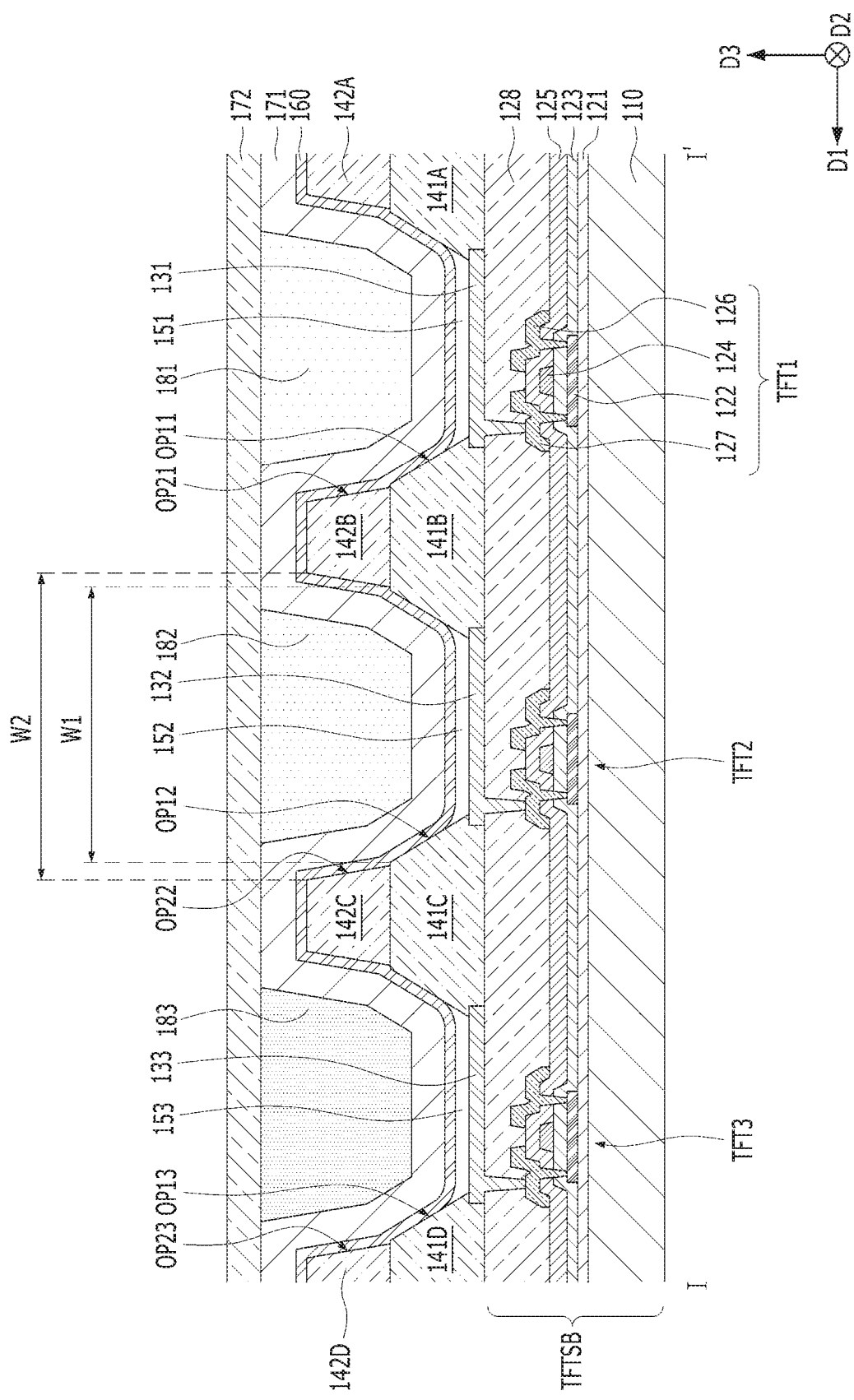
FIG. 3 is a cross-sectional view of the display apparatus of FIG. 1 taken along sectional line I-I', according to one or more exemplary embodiments.

FIG. 3 is a cross-sectional view of the display apparatus of FIG. 1 taken along sectional line I-I', according to one or more exemplary embodiments.

Referring to FIGS. 1 and 3, display apparatus 10 may include substrate 110, which may be a flexible substrate. In this manner, substrate 110 may be formed of any suitable material, such as, for example, a glass material, a quartz material, a ceramic material, a metal material, a plastic material, etc. For instance, substrate 110 may be formed of a polymer material, e.g., polyarylate (PAR), polybeneimidazole (PBI), polycarbonate (PC), polyetherimide (PEI), polyethylene naphthalate (PEN), polyethersulphone (PES), polyethylene terephthalate (PET), polysulfone, polyimide (PI), etc.

Although not illustrated, substrate 110 may be formed as a multilayered structure including one or more organic material layers (e.g. one or more polymer materials) and one or more inorganic material layers (e.g., one or more of silicon nitride ($SiN_x$), silicon oxide ($SiO_x$), silicon oxynitride ($SiO_xN_y$), etc.). The one or more organic material layers and the one or more inorganic material layers may be stacked in any suitable fashion, e.g., alternately stacked, symmetrically ordered, etc. It is also contemplated that one or more conductive layers, e.g., metal layers, may be embedded in substrate 110.

Buffer layer 121 may be disposed on substrate 110 to block or reduce penetration of contaminants. Buffer layer 121 may be deposited via any suitable technique, e.g., plasma-enhanced chemical vapor deposition (PECVD), atmospheric pressure CVD (APCVD), low pressure CVD (LPCVD), and/or the like. Buffer layer 121 may be formed of an inorganic material, such as $SiN_x$, $SiO_x$, $SiO_xN_y$, etc.

Thin film transistors TFT1, TFT2, and TFT3 are disposed on substrate 110 in association with pixels PXL. Each of thin film transistors TFT1 to TFT3 may include a respective active layer 122, gate electrode 124, source electrode 126, and drain electrode 127. Although illustrated as top-gate thin film transistors, it is contemplated that any suitable structure may be utilized in association with exemplary embodiments, such as bottom-gate thin film transistors, dual gate thin film transistors, etc.

Active layer 122 is disposed on substrate 110. Active layer 122 may be formed by patterning an inorganic semiconductor, such as a silicon semiconductor, oxide semiconductor, organic semiconductor, etc. For example, active layer 122 may be formed using silicon, such that an amorphous silicon layer is formed on a surface of substrate 110 and then crystallized to form a polycrystalline silicon layer. The polycrystalline silicon layer may be patterned to form active layer 122, and doped with impurities to form a source region and a drain region. Active layer 122 includes a source region, a drain region, and a channel region between the source region and the drain region.

Gate insulating layer 123 is disposed on buffer layer 121 and active layer 122. Gate insulating layer 123 may be formed of any suitable material, such as $SiO_x$, $SiN_x$, $SiO_xN_y$, etc. Gate electrode 124 may be disposed on gate insulating layer 123 in a region overlapping active layer 122. Gate electrode 124 may be connected to switching transistor 53 of FIG. 2.

Interlayer insulating layer 125 is disposed on gate insulating layer 123 and gate electrode 124. Source electrode 126 and drain electrode 127 are disposed on interlayer insulating layer 125. Source electrode 126 and drain electrode 127 may respectively contact the source region and the drain region of active layer 122 via contact holes formed in gate insulating layer 123 and interlayer insulating layer 125. Source electrode 126 may be connected to first power source voltage 56, and drain electrode 127 may be connected to an anode electrode of a corresponding OLED, e.g., pixel electrode 131.

Thin film transistors TFT1 to TFT3 may be covered by passivation layer 128. Passivation layer 128 may include one or more inorganic insulating layers and/or one or more organic insulating layers. Passivation layer 128 may be formed as a stacked structure of the inorganic layer(s) and organic insulating layer(s). For example, the inorganic insulating layer may include one of $SiO_x$, $SiN_x$, SiON, $Al_2O_3$, $TiO_2$, $Ta_2O_5$, $HfO_2$, $ZrO_2$, barium strontium titanate (BST), lead zirconate titanate (PZT), and/or the like. The organic insulating layer may include a polymer, for example, one of polymethylmethacrylate (PMMA), polystyrene (PS), a polymer derivative having a phenolic group, an acrylic polymer, imide-based polymers, aryl ether-based polymers, amide-based polymers, fluorine-containing polymers, p-xylene-based polymers, vinyl alcohol-based polymer, and/or a blend thereof.

For descriptive convenience, substrate 110, buffer layer 121, thin film transistors TFT1 to TFT3, gate insulating layer 123, interlayer insulating layer 125, and passivation layer 128 may be considered as forming thin film transistor substrate TFTSB. In this manner, OLEDs may be formed on thin film transistor substrate TFTSB and may be respectively coupled to thin film transistors TFT1 to TFT3.

Pixel electrodes 131, 132, and 133 are disposed on passivation layer 128 and are respectively connected to thin film transistors TFT1 to TFT3. Each of pixel electrodes 131 to 133 contact drain electrode 127 of a corresponding thin film transistor through a contact hole formed in passivation layer 128. Each of pixel electrodes 131 to 133 may function as an anode electrode of a corresponding OLED; however, exemplary embodiments are not limited thereto or thereby. For instance, each of pixel electrodes 131 to 133 may function as a cathode electrode of a corresponding OLED.

A patterned layer, such as a pixel definition layer, is disposed on thin film transistor substrate TFTSB. The patterned layer includes first body portions 141A, 141B, 141C, and 141D and first openings OP11, OP12, and OP13 disposed between first body portions 141A to 141D. First body portions 141A to 141D may define openings (or apertures) through which one or more electroluminescent materials of electroluminescent layers 151, 152, and 153 are to be deposited. First openings OP11 to OP13, which are defined by first body portions 141A to 141D, expose respective portions of pixel electrodes 131 to 133. First body portions 141A to 141D may cover edges of pixel electrodes 131 to 133. First body portions 141A to 141D may have a first (e.g., bottom) surface contacting thin film transistor substrate TFTSB, a second (e.g., top) surface opposing the first surface, and other surfaces extending between the first surface and the second surface. The other surfaces may be inclined between the first surface and the second surface. First openings OP11 to OP13 may have first widths W1 extending between adjacent first body portions, e.g., between first body portion 141B and first body portion 141C. For instance, first widths W1 may represent maximum distances between adjacent first body portions, e.g., maximum widths of first openings OP11 to OP13. It is noted, however, that first widths W1 may be variable along the other surfaces extending between the first surface and the second surface of the first body portions 141A to 141D.

A light-shielding layer (e.g., a black matrix) is disposed on the patterned layer. The light-shielding layer includes second body portions 142A, 142B, 142C, and 142D disposed respectively on first body portions 141A to 141D. The light-shielding layer also includes second openings OP21, OP22, and OP23 respectively overlapping first openings OP11 to OP13. Second openings OP21 to OP23 may expose portions of first openings OP11 to OP13, and may be concentrically aligned with first openings OP11 to OP13. It is also contemplated that the second openings OP21 to OP23 may respectively communicate with (e.g., open into) first openings OP11 to OP13. Second body portions 142A to 142D may be respectively disposed directly on first body portions 141A to 141D. The light-shielding layer may be configured to prevent (or at least reduce) light emitted from electroluminescent layers 151, 152, and 153 from mixing with each other. The light-shielding layer may also be configured to absorb at least some light from an ambient environment to, for instance, reduce reflection of the light.

Second body portions 142A to 142D may have a first (e.g., bottom) surface contacting first body portions 141A to 141D, a second (e.g., top) surface opposing the first surface, and other surfaces extending between the first surface and the second surface. The other surfaces may be inclined between the first surface and the second surface. Second openings OP21 to OP23 have second widths W2 between adjacent second body portions, e.g., between second body portion 142B and second body portion 142C. For instance, second widths W2 may represent maximum distances between adjacent second body portions, e.g., maximum widths of second openings OP21 to OP23. Second widths W2 may be greater than first widths W1. It is noted, however, that second widths W2 may be variable along the other surfaces extending between the first surface and the second surface of the second body portions 142A to 142D. In this manner, a width (e.g., maximum width) of a second body portion (e.g., second body portion 142C) may be smaller than a maximum width of a first body portion (e.g., first body portion 141C). In one or more exemplary embodiments, a maximum width of a second body portion (e.g., second body portion 142C) may be equivalent (or substantially equivalent) to a minimum width of a first body portion (e.g., first body portion 141C).

Electroluminescent layers 151 to 153 are respectively disposed on portions of pixel electrodes 131 to 133. As such, electroluminescent layers 151 to 153 may be disposed in first openings OP11 to OP13. For example, electroluminescent layers 151 to 153 may be disposed on surfaces of first body portions 141A to 141D, as well as pixel electrodes 131 to 133. Although not illustrated, electroluminescence layers 151 to 153 may extend into second openings OP21 to OP23.

Common electrode 160 may be disposed on electroluminescent layers 151 to 153, first body portions 141A to 141D, and second body portions 142A to 142D. It is noted that common electrode 160 may contact electroluminescent layers 151 to 153. Common electrode 160 may be connected to second power source voltage 57 of FIG. 2. In one or more exemplary embodiments, common electrode 160 may function as a cathode electrode of one or more OLEDs of display apparatus 10; however, exemplary embodiments are not limited thereto or thereby. For instance, common electrode 160 may function as an anode electrode of one or more OLEDs of display apparatus 10.

First pixel electrode 131, first electroluminescent layer 151, and common electrode 160 may form a first OLED. Second pixel electrode 132, second electroluminescent layer 152, and common electrode 160 may form a second OLED. Third pixel electrode 133, third electroluminescence layer 153, and common electrode 160 may form a third OLED. It is noted that the first to third OLEDs may emit the same color as one another, such as a white color, a blue color, etc. As another example, first to third OLEDs may emit different colors, such as red, green, and blue colors. It is contemplated, however, that any other suitable color of light may be emitted from one or more of first to third OLEDs.

Thin film transistors TFT1 to TFT3 are connected to the first to third OLEDs, respectively. Each of thin film transistors TFT1 to TFT3 may be driving transistors 54 of respective OLEDs of FIG. 2. Although not illustrated in FIG. 3, it is contemplated that thin film transistor substrate TFTSB may further include switching transistor 53 and sustain capacitor 55.

First insulating layer 171 is disposed on common electrode 160. First insulating layer 171 may extend into first openings OP11 to OP13 and second openings OP21 to OP23. Second insulating layer 172 is disposed on first insulating layer 171, as well as disposed on color filters 181, 182, and 183.

First insulating layer 171 and second insulating layer 172 may form an encapsulation film that covers pixel electrodes 131 to 133, common electrode 160, first body portions 141A to 141D, second body portions 142A to 142D, and electroluminescent layers 151 to 153. The encapsulation film may prevent (or at least reduce) electroluminescent layers 151 to 153 from being deteriorated by, for instance, moisture and/or oxygen from an ambient environment. Each of first insulating layer 171 and second insulating layer 172 may be (or include) at least one organic layer and/or inorganic layer. The inorganic layer may function to inhibit the penetration of moisture, oxygen, and/or the like, into electroluminescent layers 151 to 153. The organic layer may function to relieve stress of the inorganic layer, to complement defects of the inorganic layer, and/or to planarize first insulating layer 171 and second insulating layer 172.

Although two insulating layers are shown, exemplary embodiments are not limited thereto or thereby. For instance, more than two insulating layers may be provided for encapsulation. For example, one or more of first insulating layer 171 and second insulating layer 172 may correspond to stacks of organic and/or inorganic insulating layers.

Color filters 181 to 183 are disposed on first insulating layer 171 and at least overlap electroluminescent layers 151 to 153, respectively. Color filters 181 to 183 may filter light emitted from electroluminescent layers 151 to 153, respectively, such as tune a color of the light. Each of color filters 181 to 183 is configured to selectively pass (or transmit) light of a given range of wavelengths. For instance, each of color filters 181 to 183 is one of a blue color filter, a green color filter, a red color filter, a yellow color filter, etc. In other words, any suitable color filter may be utilized in association with exemplary embodiments.

According to one or more exemplary embodiments, color filters 181 to 183 may include particles suspended therein. The particles may be configured to scatter light emitted from electroluminescent layers 151 to 153. For example, the particles may include any suitable material for scattering light, such as $ZrO_2$, $TiO_2$, etc. In one or more exemplary embodiments, the particles may correspond to quantum dots, e.g., semiconductor crystals, such as semiconductor nanocrystals. In this manner, the particles may be photo-active (e.g., photoluminescent) and/or electro-active (e.g., electroluminescent). As such, the particles may enhance (e.g., widen, purify, etc.) a color gamut of pixels PXL of display apparatus 10.

Color filters 181 to 183 are disposed between first insulating layer 171 and second insulating layer 172. Color filters 181 to 183 may include chromogenic materials and organic materials in which chromogenic materials are distributed. The chromogenic materials may be common pigments or dyes, and the organic materials may be common dispersing agents. Color filters 181 to 183 may function to relieve stress of first insulating layer 171 and second insulating layer 172, to complement defects in, for instance, an inorganic layer, and/or to planarize surfaces of color filters 181 to 183. Color filters 181 to 183 may be disposed in concave portions of first insulating layer 171. The concave portions may correspond to first openings OP11 to OP13 and/or second openings OP21 to OP23.

According to one or more exemplary embodiments, the light-shielding layer may be provided to prevent (or reduce) light emitted from electroluminescent layers 151 to 153 from mixing and to reduce reflection of ambient light. Moreover, a determined thickness of a color filter over a threshold thickness value may improve color reproducibility of display apparatus 10. In other instances, a color filter thicker than a determined threshold may increase reliability and manufacturing yield. Furthermore, a color filter thicker than a determined threshold may enable a suitable amount of pigments to be provided such that a filtering function may be improved. It is noted, however, that the thickness of a color filter is typically balanced with an attempt to reduce an overall thickness of a display apparatus.

According to one or more exemplary embodiments, first body portions 141A to 141D of the patterned layer and second body portions 142A to 142D of the light-shielding layer are stacked on one another, and color filters 181 to 183 are disposed in first openings OP11 to OP13 and second openings OP21 to OP23 to not only increase thicknesses of color filters 181 to 183 and to provide light-blocking effects, but also to reduce an overall thickness of display apparatus 10. To this end, the respective heights of first body portions 141A to 141D and second body portions 142A to 142D may be determined to provide a determined thickness of color filters 181 to 183. It is also noted that reducing the overall thickness of display apparatus 10 may increase the flexibility of display apparatus 10.

In one or more exemplary embodiments, color filters 181 to 183 may fill concave portions of first insulating layer 171, and may be disposed between first insulating layer 171 and second insulating layer 172. Color filters 181 to 183 may planarize a surface on which second insulating layer 172 is disposed. In this manner, a surface (e.g., uppermost surface) of second insulating layer 172 may be planar.

Color filters 181 to 183 may extend from second insulating layer 172 into second openings OP21 to OP23, respectively. To this end, color filters 181 to 183 may have a first surface closer to second insulating layer 172 and a second surface opposing the first surface. Second body portions 142A to 142D may have a first surface closer to second insulating layer 172 and a second surface opposing the first surface. In this manner, the second surface of color filters 181 to 183 may be closer to thin film transistor substrate TFTSB than the first surface of second body portions 142A to 142D.

In one or more exemplary embodiments, color filters 181 to 183 may extend into second openings OP21 to OP23 and first openings OP11 to OP13. First body portions 141A to 141D may have a first surface closer to second insulating layer 172 and a second surface opposing the first surface. The second surface of color filters 181 to 183 may be closer to thin film transistor substrate TFTSB than the first surface of first body portions 141A to 141D.

For instance, the thicknesses of first body portions 141A to 141D may be greater than 0 μm and less than or equal to 2 μm, such as about 1.5 μm. The thicknesses of second body portions 142A to 142D may be greater than or equal to 1 μm and less than or equal to 2.5 μm, such as greater than or equal to 1.5 μm and less than or equal to 2 μm. The thicknesses of pixel electrodes 131 to 133 may be greater than 0 Å and less than or equal to 2000 Å, such as greater than or equal 1000 Å and less than or equal to 1500 Å, e.g., about 1200 Å. The thicknesses of electroluminescent layers 151 to 153 may be greater than 0 Å and less than or equal to 3000 Å, such as greater than or equal to 1000 Å and less than or equal to 2500 Å, e.g., about 2200 Å. The thicknesses of common electrode 160 in regions overlapping electroluminescent layers 151 to 153 may be greater than or equal to 50 Å and less than or equal to 750 Å, such as greater than or equal to 100 Å and less than or equal to 700 Å, e.g., about 120 Å to about 670 Å. The thicknesses of first insulating layer 171 in regions overlapping electroluminescent layers 151 to 153 may be greater than 0 μm and less than or equal to 1.5 μm, such as about 1 μm. The thickness of second insulating layer 172 may be greater than 0 Å and less than or equal to 8000 Å, such as greater than or equal to 5000 Å and less than or equal to 7500 Å, e.g., about 7000 Å. The thicknesses of color filters 181 to 183 may be greater than or equal to 2 μm and less than or equal to 5 μm, such as greater than or equal to 2.5 μm and less than or equal to 4.5 μm, e.g., about 3 μm to about 4 μm.

According to one or more exemplary embodiments, a height of the first surfaces of the color filters 181 to 183 from an upper surface of thin film transistor substrate TFTSB may be less than or equal to a height of uppermost surfaces of first insulating layer 171 in regions overlapping first body portions 141A to 141D and second body portions 142A to 142D. Further, first insulating layer 171 and second insulating layer 172 may contact each other in regions overlapping first body portions 141A to 141D and second body portions 142A to 142D.

FIGS. 4A to 4E are cross-sectional views of a display apparatus at various stages of manufacture, according to one or more exemplary embodiments.

Figure 4A:
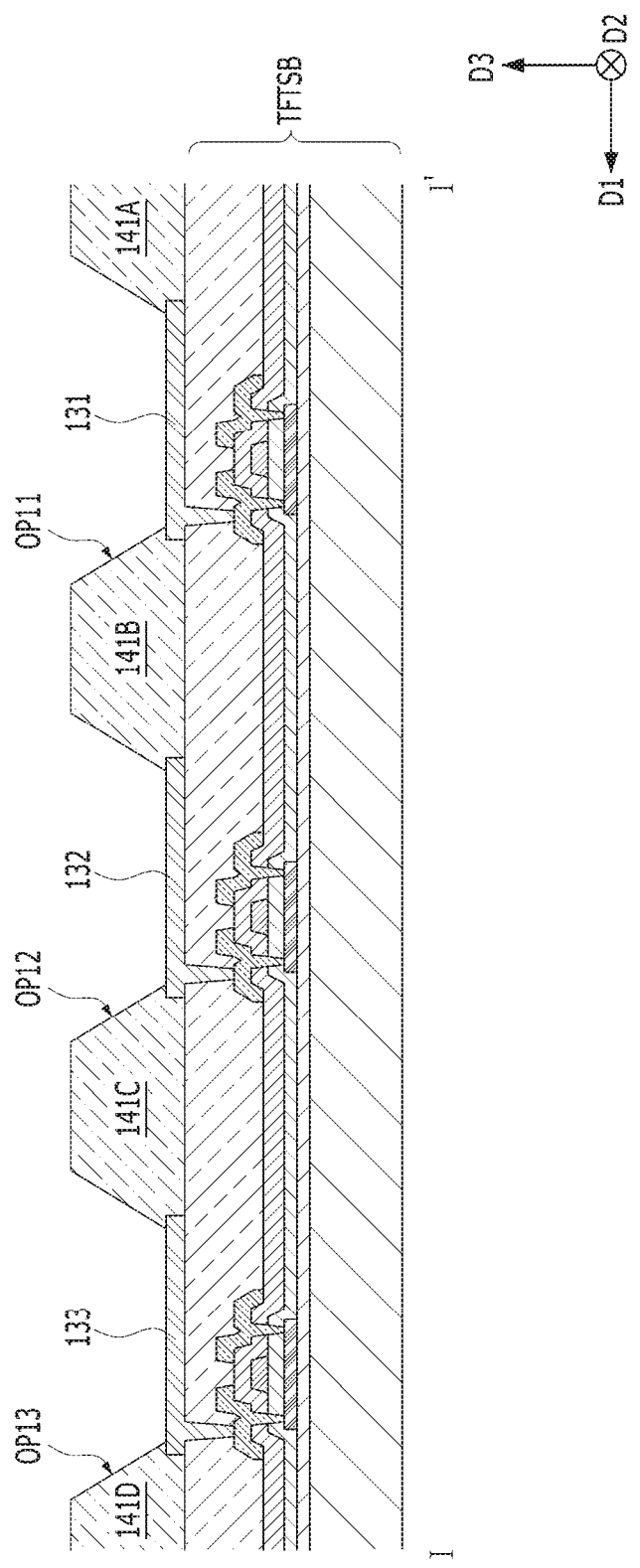
FIGS. 4A, 4B, 4C, 4D, and 4E are cross-sectional views of a display apparatus at various stages of manufacture, according to one or more exemplary embodiments.

Referring to FIG. 4A, pixel electrodes 131 to 133 are formed on thin film transistor substrate TFTSB. Each of pixel electrodes 131 to 133 may be formed by patterning one or more deposited conductive layers into an island form. In one or more exemplary embodiments, at least portions of the islands may correspondingly overlap with first openings OP11 to OP13 of the patterned layer, as will become more apparent below. Pixel electrodes 131 to 133 may include a reflecting layer formed of at least one of silver (Ag), magnesium (Mg), aluminum (Al), platinum (Pt), palladium (Pd), gold (Au), nickel (Ni), neodymium (Nd), iridium (Ir), and chromium (Cr). Pixel electrodes 131 may include a transparent layer disposed on the reflecting layer. The transparent layer may be formed of at least one of indium tin oxide (ITO), indium zinc oxide (IZO), zinc oxide (ZnO), indium oxide ($In_2O_3$), indium gallium oxide (IGO), aluminum zinc oxide (AZO), etc. In this manner, pixel electrodes 131 to 133 may be formed with a single layer or a multiple layer configuration. For instance, pixel electrodes 131 to 133 may include a layer formation of ITO/Ti/ITO, $Ti_xO_y$/Ag/$Ti_xO_y$, etc.

A patterned layer may be formed on and overlapping portions of pixel electrodes 131 to 133. First apertures in the patterned layer may expose other portions of pixel electrodes 131 to 133. As seen in FIG. 4A, the patterned layer may include first body portions 141A to 141D disposed on thin film transistor substrate TFTSB. The first body portions 141A to 141D may include first openings OP11 to OP13 corresponding to the first apertures.

In one or more exemplary embodiments, a layer of organic insulating material may be deposited on pixel electrodes 131 to 133 and thin film transistor substrate TFTSB via any suitable deposition technique. The deposited organic insulating material may include, for instance, at least one of polystyrene, poly methyl methacrylate (PMMA), polyacrylonitrile (PAN), polyamide, polyimide, polyarylether, heterocyclic polymer, parylene, fluorine series polymer, epoxy resin, acrylic resin, benzocyclobutene series resin, siloxane series resin, and silane. Exemplary embodiments are not limited thereto or thereby. The deposited organic insulating material may then be patterned to form first body portions 141A to 141D including first openings OP11 to OP13.

Figure 4B:
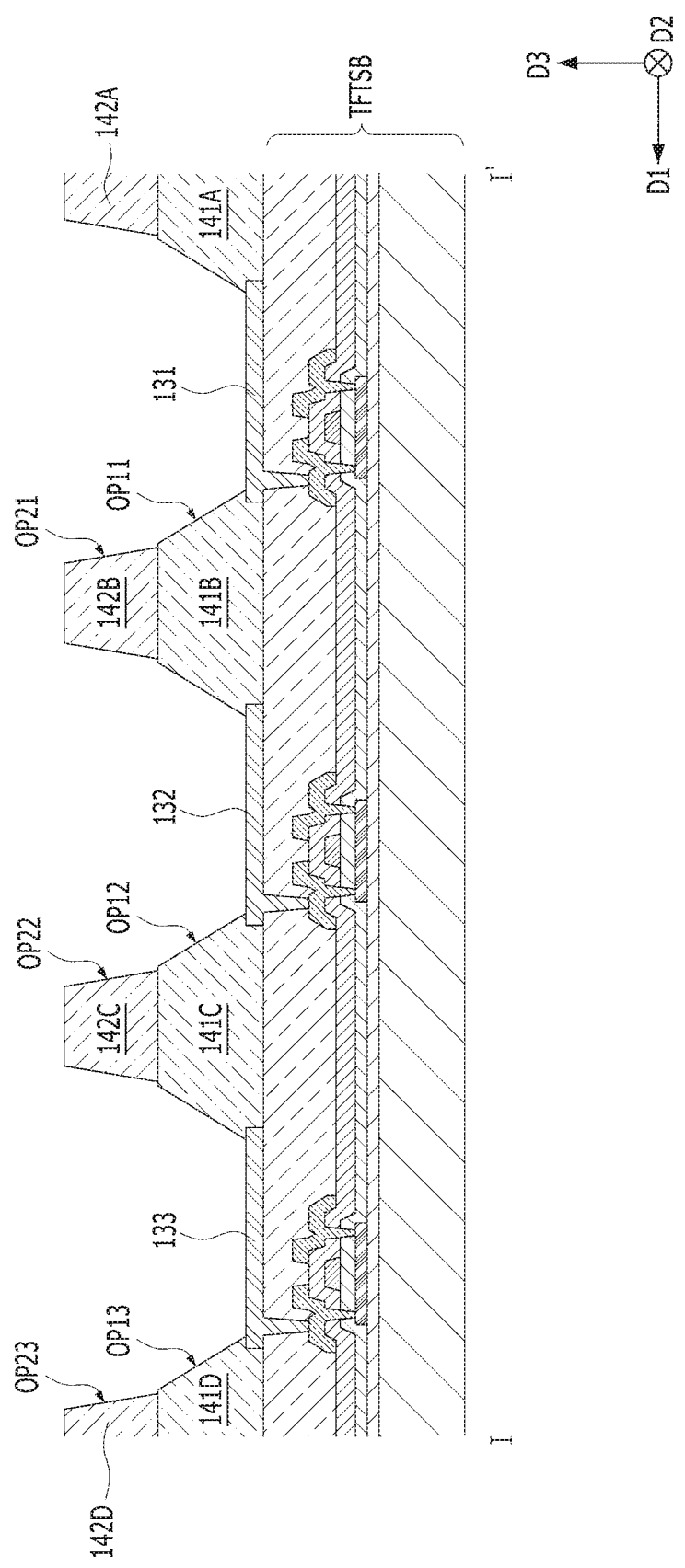

As seen in FIG. 4B, a light-shielding layer including second openings OP21 to OP23 at least partially overlapping first openings OP11 to OP23 may be formed on the patterned layer. The light-shielding layer may include second body portions 142A to 142D disposed on first body portions 141A to 141D, respectively. Second body portions 142A to 142D may provide second openings OP21 to OP23 as second apertures.

In one or more exemplary embodiments, second body portions 142A to 142D may be formed of any suitable material for absorbing light, such as an organic material having a high light absorptivity. Second body portions 142A to 142D may include at least one of black pigment and black dye. For example, second body portions 141A to 142D may include at least one of aniline black, carbon black, lamp black, graphite, paliogen black, and perylene black.

It is noted that electroluminescent layers 151 to 153 may be damaged or at least deteriorated by exposure to excessive heat and/or oxygen. According to one or more exemplary embodiments, the light-shielding layer may be formed before formation of electroluminescent layers 151 to 153 are formed. In this manner, the light-shielding layer may be formed using a relatively high temperature process and/or a relatively low temperature process without affecting formation of electroluminescent layers 151 to 153. It is noted, however, that the light-shielding layer may be formed after formation of electroluminescent layers 151 to 153.

Figure 4C:
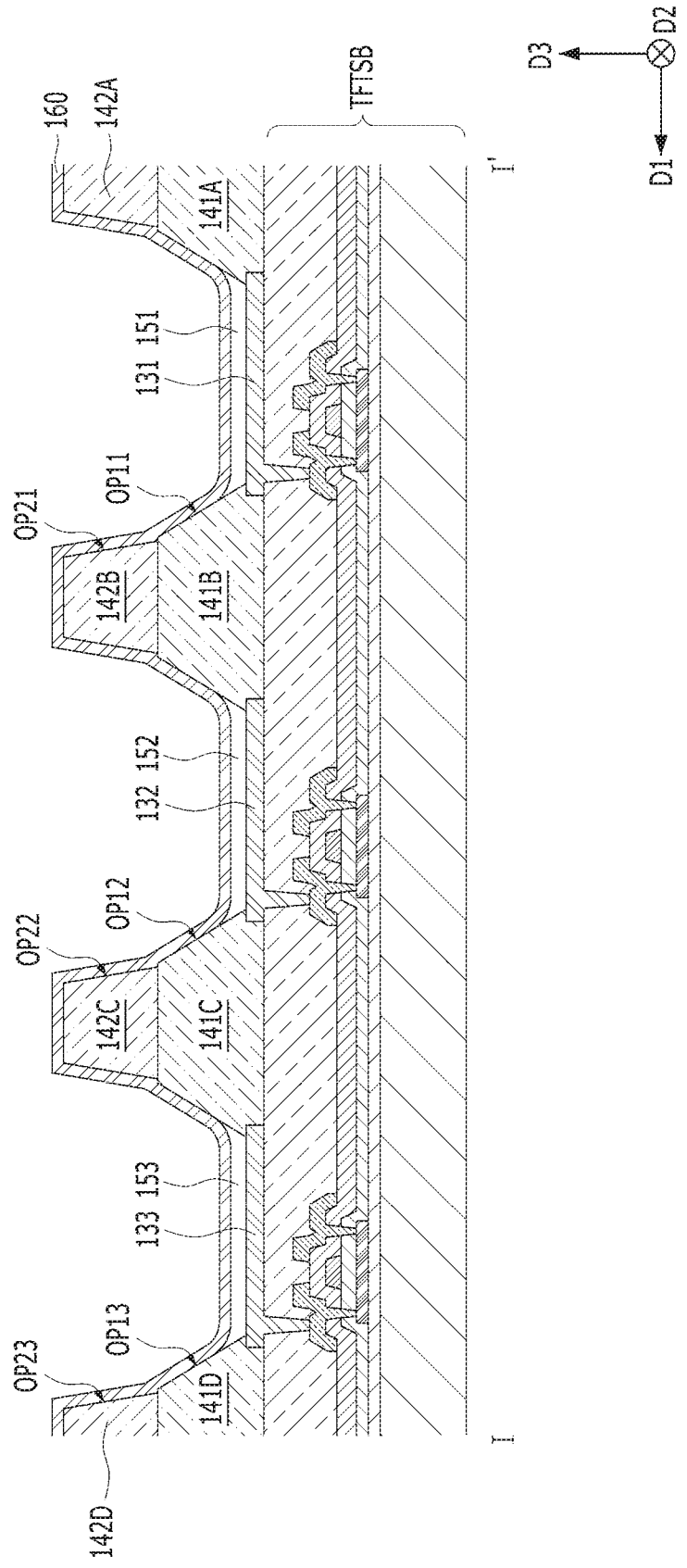

Adverting to FIG. 4C, electroluminescent layers 151 to 153 may be at least deposited on exposed portions of pixel electrodes 131 to 133, respectively. In this manner, electroluminescent layers 151 to 153 may be deposited through first openings OP11 to OP13 and/or second openings OP21 to OP23. For instance, when the light-shielding layer is formed before formation of electroluminescent layers 151 to 153, a material forming electroluminescent layers 151 to 153 may be deposited through second openings OP21 to OP23 and first openings OP11 to OP13.

Common electrode 160 may be formed on electroluminescent layers 151 to 153, first body portions 141A to 141D, and second body portions 142A to 142D. For instance, common electrode 160 may be formed by depositing a transparent layer of at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and alloys thereof. It is also contemplated that common electrode 160 may be formed of indium tin oxide (ITO), indium zinc oxide (IZO), zinc oxide (ZnO), indium oxide ($In_2O_3$), indium gallium oxide (IGO), aluminum zinc oxide (AZO), etc. It is also contemplated that a workfunction of common electrode 160 may be smaller than a work-function of pixel electrodes 131 to 133.

Figure 4D:
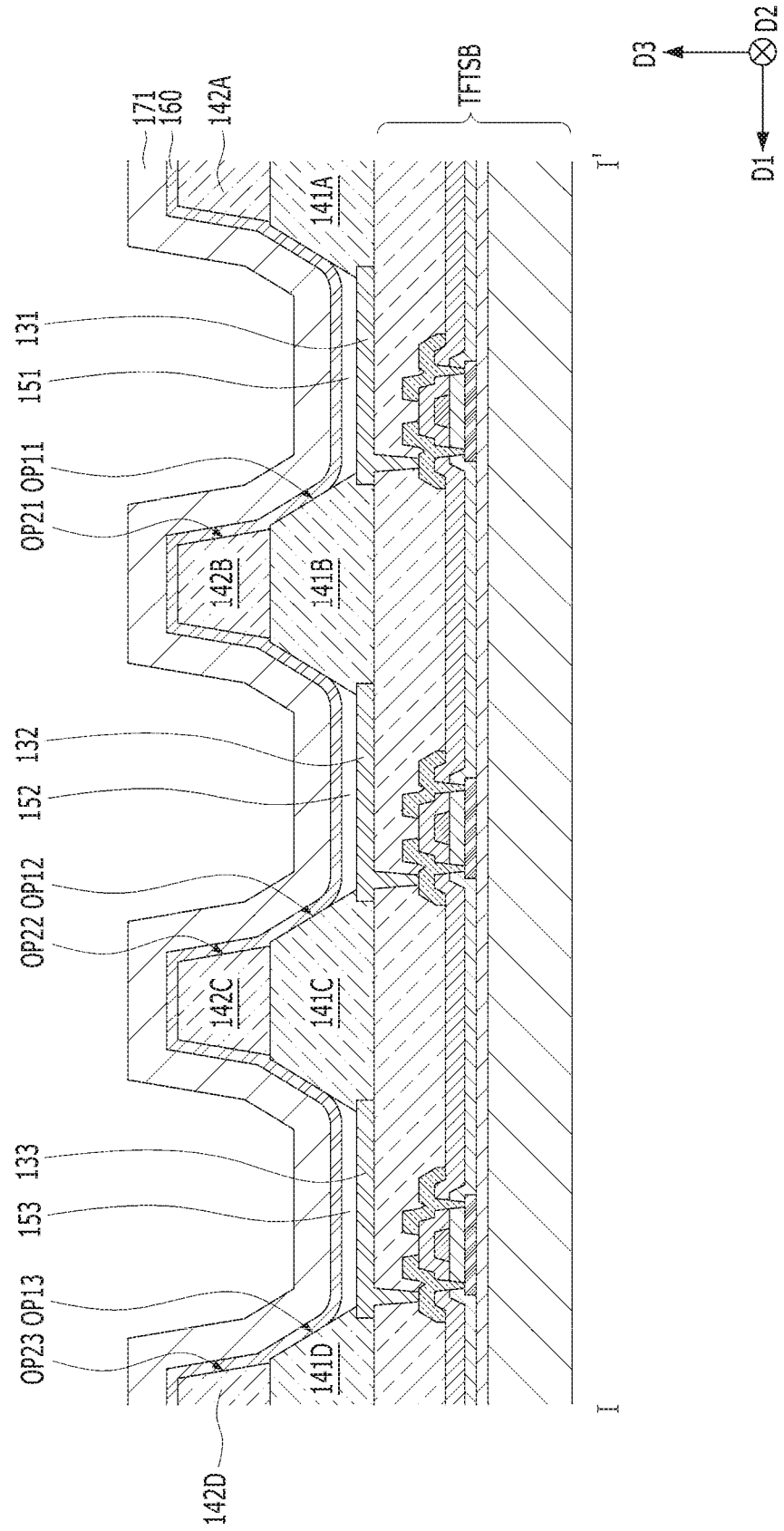

Referring to FIG. 4D, first insulating layer 171 is formed on common electrode 160. First insulating layer 171 may be formed of at least one of an organic layer and inorganic layer. Any suitable deposition technique may be utilized to form first insulating layer 171. In one or more exemplary embodiments, an inorganic layer may include any suitable material to prevent or reduce penetration of external moisture, oxygen, and/or the like, such as metal oxides, metal nitrides, metal carbides, and compounds thereof, for example, at least one of aluminum oxide, silicon oxide, silicon nitride, etc. An organic layer may include any suitable material for relieving stress of the inorganic layer and/or to planar upper surfaces of first insulating layer 171 and/or later formed structures. The organic layer may be formed of, for instance, a polymeric organic compound including at least one of epoxy, acrylate, and urethane acrylate.

Figure 4E:
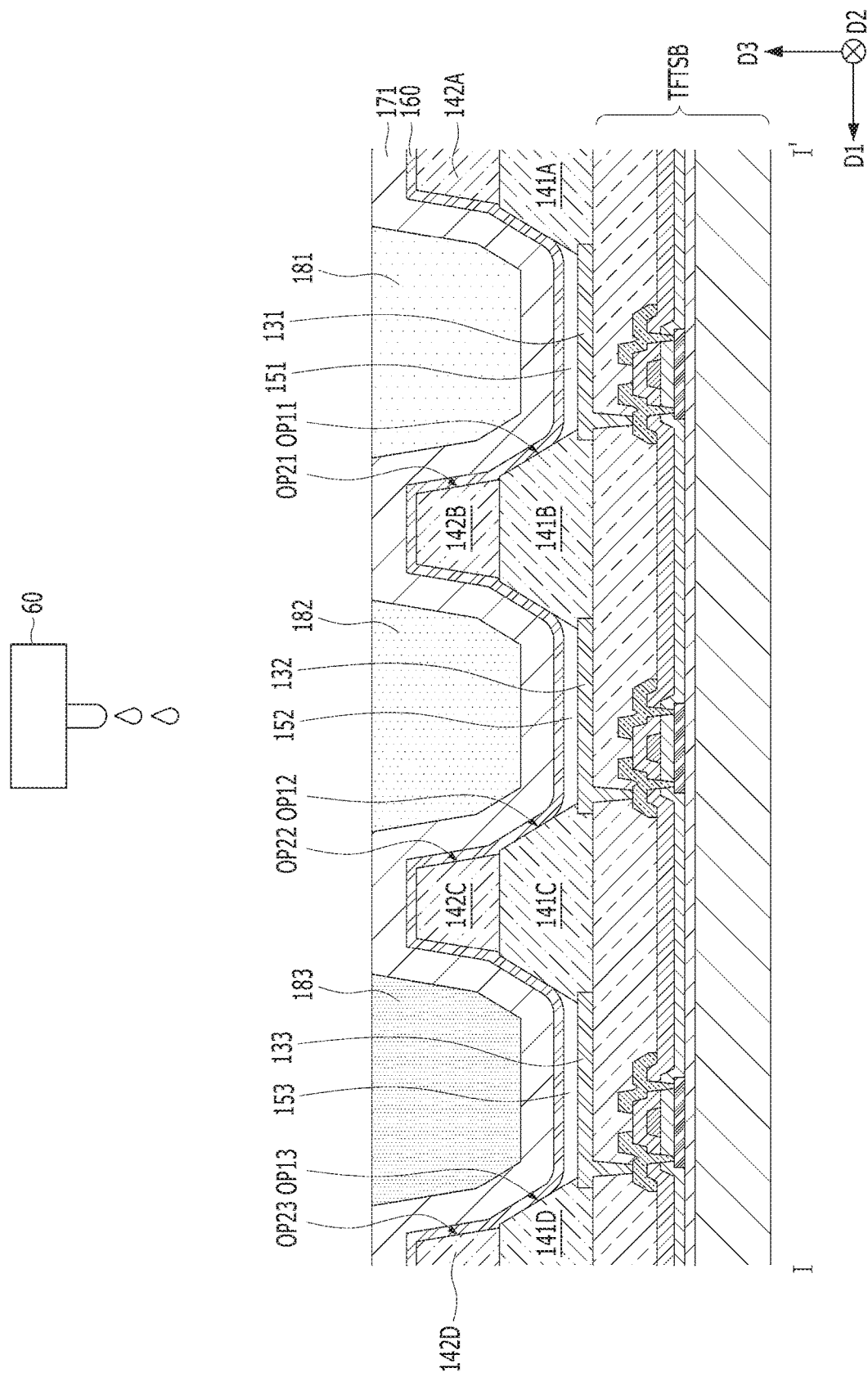

Adverting to FIG. 4E, color filters 181 to 183 are formed in concave portions of first insulating layer 171 that correspond to first openings OP11 to OP13 and second openings OP21 to OP23. In one or more exemplary embodiments, color filters 181 to 183 may be formed using an inkjet printing manner, however, exemplary embodiments are not limited thereto or thereby. For example, inkjet head unit 60 may be disposed above first insulating layer 171 and may deposit ink corresponding to materials of color filters 181 to 183 in the concave portions of first insulating layer 171. The deposited materials may be cured by, for example, exposing the deposited material to a determined temperature and/or radiating the deposited material with ultraviolet rays.

Referring to FIG. 3, second insulating layer 172 may be formed on first insulating layer 171 and color filters 181 to 183. Second insulating layer 172 may be formed of at least one of an organic layer and/or inorganic layer. It is noted that first insulating layer 171, second insulating layer 172, and color filters 181 to 183 may function as an encapsulation layer configured to prevent or at least reduce exposure of electroluminescent layers 151 to 153 to contaminants, e.g., moisture, oxygen, and/or the like.

Figure 5:
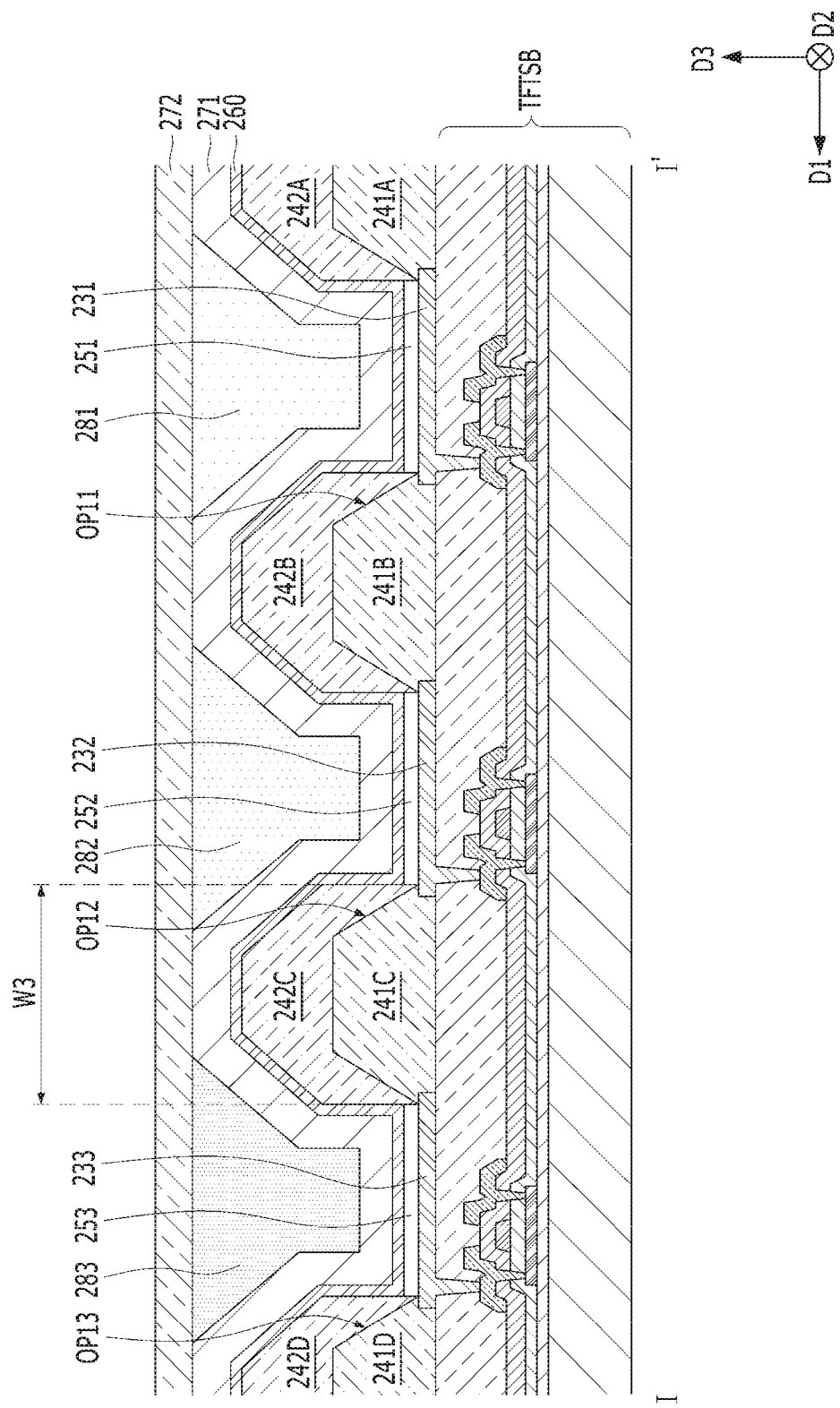
FIG. 5 is a cross-sectional view of the display apparatus of FIG. 1 taken along sectional line I-I', according to one or more exemplary embodiments.

FIG. 5 is a cross-sectional view of the display apparatus of FIG. 1 taken along sectional line I-I', according to one or more exemplary embodiments. Display apparatus 10 of FIG. 5 is similar to display apparatus 10 of FIG. 3, and, as such, duplicative descriptions are primarily omitted to avoid obscuring exemplary embodiments.

Referring to FIG. 5, display apparatus 10 includes thin film transistor substrate TFTSB, pixel electrodes 231, 232, and 233, a patterned layer having first body portions 241A, 241B, 241C, and 241D, a light-shielding layer having second body portions 242A, 242B, 242C, and 242D, electroluminescent layers 251, 252, and 253, common electrode 260, first insulating layer 271, second insulating layer 272, and color filters 281, 282, and 283.

First body portions 241A to 241D of the patterned layer include first openings OP11 to OP13 as described with reference to FIG. 3. Second body portions 242A to 242D of the light-shielding layer are disposed on first body portions 241A to 241D of the patterned layer, respectively. As seen in FIG. 5, the maximum widths of second body portions 242A to 242D of the light-shielding layer are wider than the maximum widths of second body portions 142A to 142D of FIG. 3, and, as such, reflection of ambient light may be decreased. In a conventional display apparatus, a light-shielding layer may be disposed above an encapsulation layer, and, as such, the light-shielding layer may be relatively much further from electroluminescent layers 251 to 253. In this manner, a viewing angle of light emitted from corresponding pixels may be narrowed.

According to one or more exemplary embodiments, the light-shielding layer includes second body portions 242A to 242D disposed on first body portions 241A to 241D, each of which may be disposed below an encapsulation layer formed of, for instance, first insulating layer 271 and second insulating 272. Given that the light-shielding layer is relatively closer to electroluminescent layers 251 to 253 than in a conventional display apparatus, sufficient viewing angles may be obtained even though corresponding maximum widths of second body portions 242A to 242D of the light-shielding layer are formed wider than corresponding maximum widths of second body portions 142A to 142D in the display apparatus of FIG. 3.

In one or more exemplary embodiments, second body portions 242A to 242D correspondingly extend into first openings OP11 to OP13 that are disposed between first body portions 241A to 241D. Further, second body portions 242A to 242D may be respectively disposed on uppermost surfaces of first body portions 241A to 241D, as well as at least portions of the inclined surfaces of first body portions 241A to 241D extending between the uppermost surfaces and surfaces opposing the uppermost surfaces. For example, second body portion 242B extends into first openings OP11 and OP12, whereas second body portion 242C extends into first openings OP12 and OP13. In one or more exemplary embodiments, each of second body portions 242A to 242D may have third width W3 extending between opposing surfaces in the first direction D1. For instance, third width W3 may be a maximum width of a corresponding second body portion of second body portions 242A to 242D. Further, third width W3 may be equivalent (or substantially equivalent) to a maximum width of a corresponding first body portion of first body portions 241A to 241D.

Common electrode 260, first insulating layer 271, color filters 281 to 283, and second insulating layer 272 are disposed on thin film transistor substrate TFTSB. It is contemplated that the shapes of common electrode 260, first insulating layer 271, color filters 281 to 283, and second insulating layer 272 may vary depending on the shapes of second body portions 242A to 242D.

Figure 6:
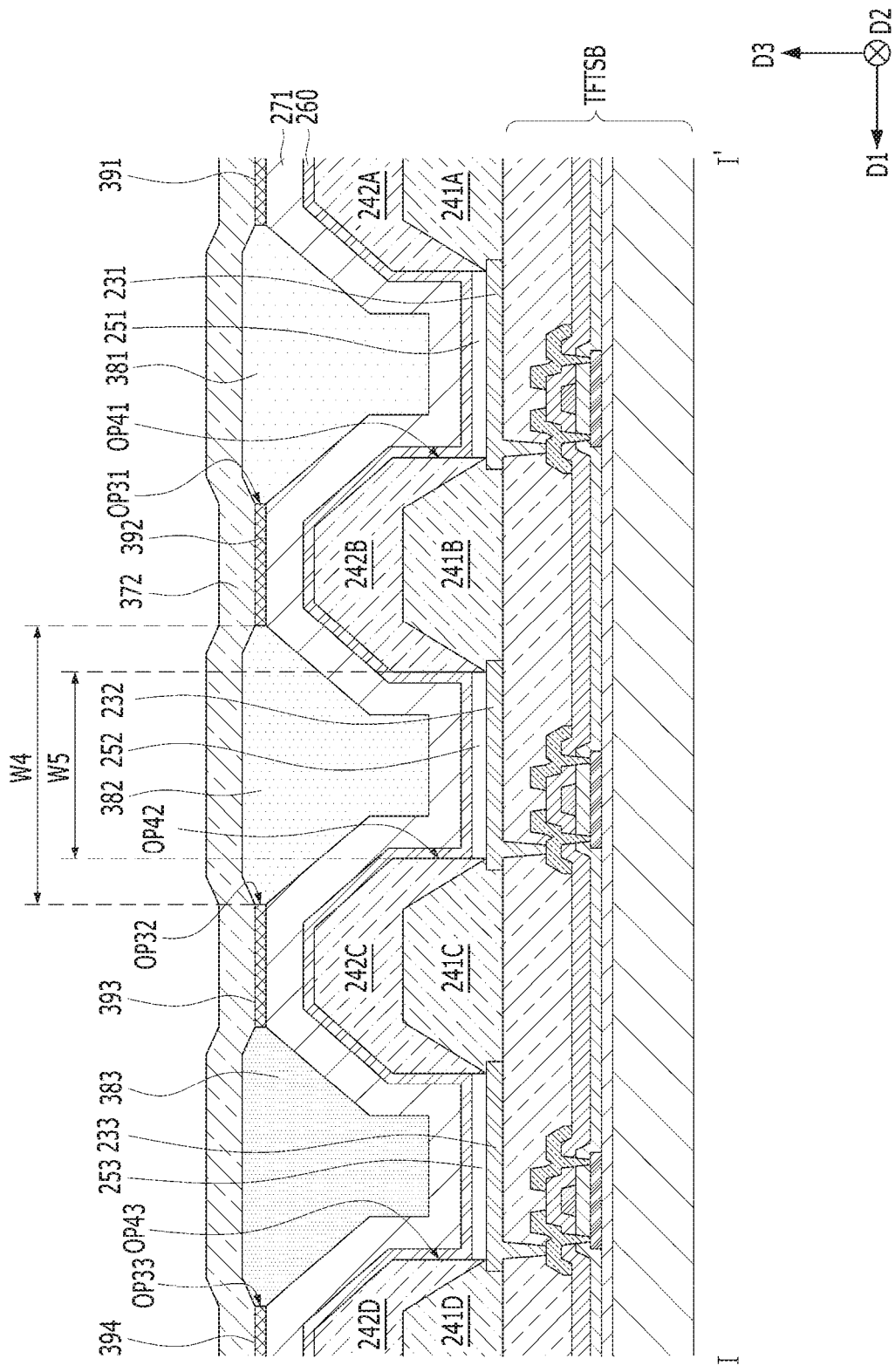
FIG. 6 is a cross-sectional view of the display apparatus of FIG. 1 taken along sectional line I-I', according to one or more exemplary embodiments.

FIG. 6 is a cross-sectional view of the display apparatus of FIG. 1 taken along sectional line I-I', according to one or more exemplary embodiments. Display apparatus 10 of FIG. 6 is similar to display apparatus 10 of FIGS. 3 and 5, and, as such, duplicative descriptions are primarily omitted to avoid obscuring exemplary embodiments.

Referring to FIG. 6, a barrier layer including third body portions 391, 392, 393, and 394 is further disposed between first insulating layer 271 and second insulating layer 372 in regions overlapping second body portions 242A to 242D and first body portions 241A to 241D. Third body portions 391 to 394 include third openings (or apertures) OP31, OP32, and OP33 disposed therebetween. In one or more exemplary embodiments, third openings OP31 to OP33 may have fourth widths W4 greater than fifth widths W5. It is noted that fifth widths W5 correspond to widths (e.g., minimum widths) of fourth openings OP41, OP42, and OP43 extending, in the first direction D1, between adjacent second body portions of second body portions 242A to 242D. It is also noted that second body portions 242A to 242D may at least extend in third direction D3 into first openings OP11 to OP13, such as illustrated in FIGS. 5 and 6. Further, widths (e.g., maximum widths) of third body portions 391 to 394 may be narrower than maximum widths of second body portions 242A to 242D. Exemplary embodiments, however, are not limited thereto or thereby. It is also contemplated that maximum widths of third body portions 391 to 394 may be greater than minimum widths of second body portions 242A to 242D. Also, third body portions 391 to 394 may be disposed on at least portions of top surfaces of first insulating layer 271 in regions overlapping second body portions 242A to 242D and first body portions 241A to 241D.

Color filters 381, 382, and 383 are disposed in concave portions defined by first insulating layer 271 and third body portions 391 to 394. As such, color filters 381 to 383 may extend into third openings OP31 to OP33. Second insulating layer 372 is disposed on color filters 381 to 383 and third body portions 391 to 394. First insulating layer 271, second insulating layer 372, color filters 381 to 383, and the barrier layer including third body portions 391 to 394 may function as an encapsulation layer configured to prevent or at least reduce contaminants from degrading electroluminescent layers 251 to 253.

According to one or more exemplary embodiments, third body portions 391 to 394 may include a lyophobic material resistive to materials of color filters 381 to 383. For instance, third body portions 391 to 394 may include fluorine-based compounds, such as a fluorinated silane-based promoter, a fluorinated acrylic monomer, a fluorinated alkyl-based photo resist, and the like. In this manner, when color filters 381 to 383 are being formed in corresponding concave portions of first insulating layer 271, the material of the color filters 381 to 383 may be repelled from overlapping third body portions 391 to 394.

Figure 7A:
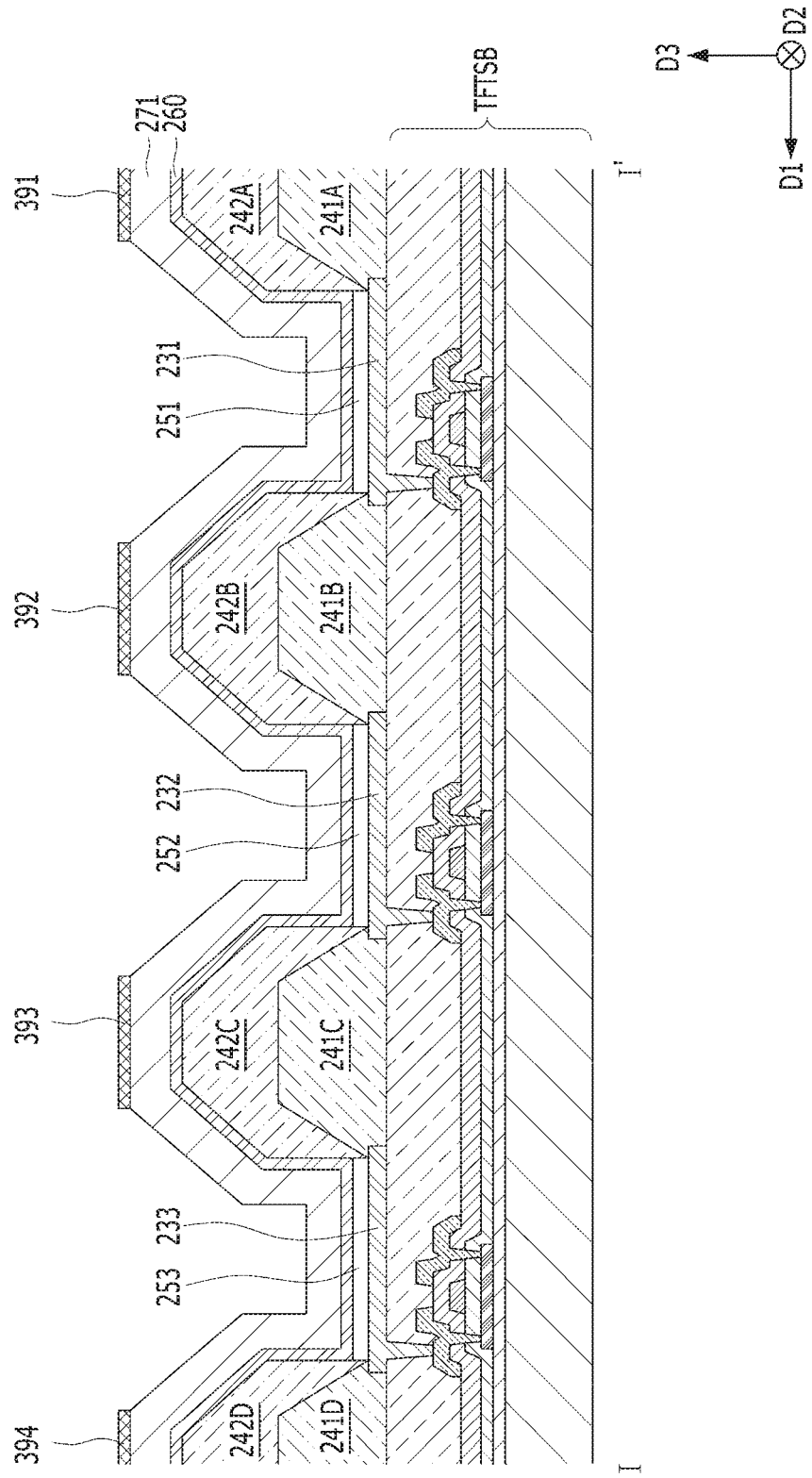
FIGS. 7A and 7B are cross-sectional views of a display apparatus at various stages of manufacture, according to one or more exemplary embodiments.
Figure 7B:
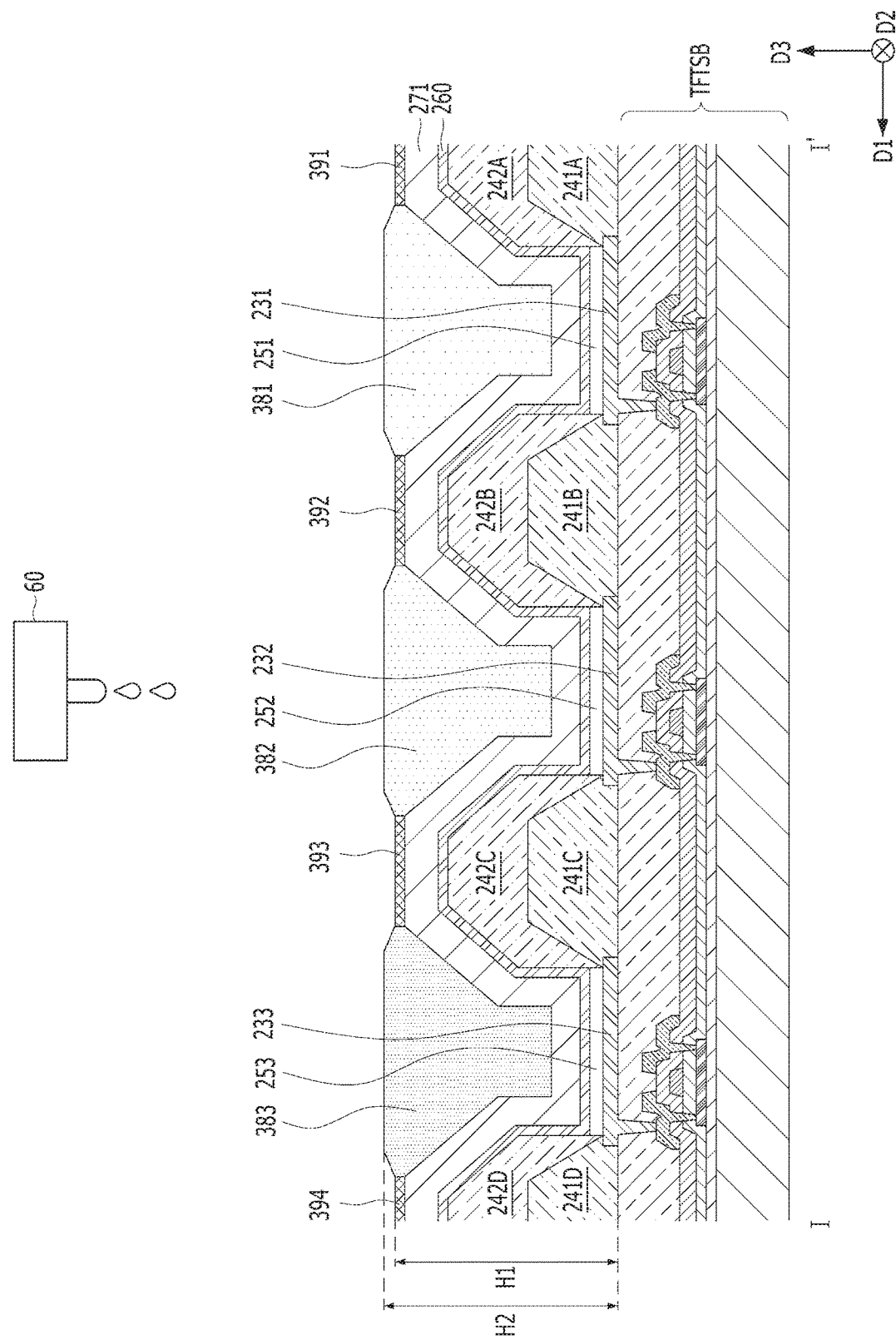

FIGS. 7A and 7B are cross-sectional views of a display apparatus at various stages of manufacture, according to one or more exemplary embodiments. A formation process of FIGS. 7A and 7B is similar to the formation process of FIGS. 4A to 4E, and, as such, duplicative descriptions are primarily omitted to avoid obscuring exemplary embodiments.

Referring to FIG. 7A, pixel electrodes 231 to 233, a patterned layer including first body portions 241A to 241D, a light-shielding layer including second body portions 242A to 242D, electroluminescent layers 251 to 253, common electrode 260, and first insulating layer 271 are formed on thin film transistor substrate TFTSB. A barrier layer including third body portions 391 to 394 may be formed on first insulating layer 271 in regions overlapping first body portions 241A to 241D and second body portions 242A to 242D.

Referring to FIG. 7B, color filters 381 to 383 are formed in the concave portions of first insulating layer 271. For instance, inkjet head unit 60 may be disposed above concave portions of first insulating layer 271, and may deposit material corresponding to materials of color filters 381 to 383 into the concave portions. Uppermost surfaces of third body portions 391 to 394 may have first height H1 from thin film transistor substrate TFTSB. The materials filled in the concave portions of first insulating layer 271 may have second height H2 from thin film transistor substrate TFTSB. In this manner, a determined amount materials to form color filters 381 to 383 may be filled in the concave portions of first insulating layer 271. In one or more exemplary embodiments, second height H2 may be less than first height H1. According to one or more exemplary embodiments, second height H2 may be substantially equivalent to first height H1. In this manner, second insulating layer 372 may be disposed on a substantially planar surface of color filters 381 to 383 and an uppermost surface of first insulating layer 271.

According to one or more exemplary embodiments, second height H2 may be greater than first height H1, as shown in FIG. 7B. For example, inkjet head unit 60 may fill a determined amount of material into the concave portions of the first insulating layer 271. It is noted, however, that some additional material may be deposited in at least some of the concave portions of the first insulating layer 271 due to, for instance, manufacturing tolerances. Third body portions 391 to 394, however, may be formed to include a lyophobic material resistive to materials of color filters 381 to 383. In this manner, third body portions 391 to 394 may prevent (or at least reduce) a potential of the materials of color filters 381 to 383 from overlapping uppermost surfaces of third body portions 391 to 394. As such, a potential for the materials of color filters 381 to 383 to be mixed with one another may be reduced. In this manner, purity of color filters 381 to 383 may be maintained, and manufacturing yield may be improved.

Second insulating layer 372 may be formed on color filters 381 to 383 and third body portions 391 to 394, as seen in FIG. 6. It is noted that an upper surface of second insulating layer 372 may have a shape depending on a shape of an upper surface of color filters 381 to 383 and third body portions 391 to 394, however, exemplary embodiments are not limited thereto or thereby. For example, an uppermost surface of second insulating layer 372 may be planar.

Figure 8:
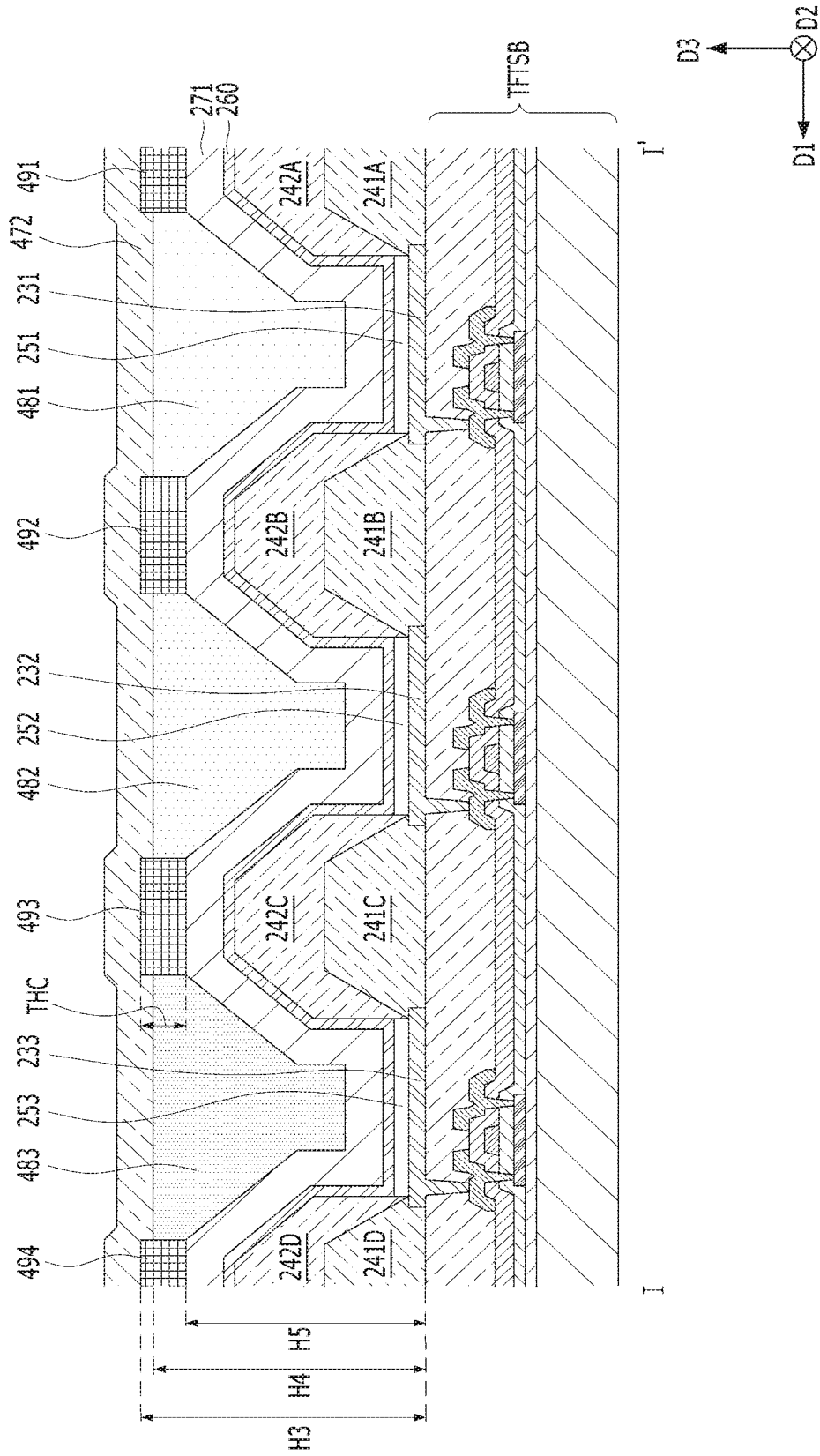
FIG. 8 is a cross-sectional view of the display apparatus of FIG. 1 taken along sectional line I-I', according to one or more exemplary embodiments.

FIG. 8 is a cross-sectional view of the display apparatus of FIG. 1 taken along sectional line I-I', according to one or more exemplary embodiments. Display apparatus 10 of FIG. 8 is similar to display apparatus 10 of FIGS. 3, 5, and 6, and, as such, duplicative descriptions are primarily omitted to avoid obscuring exemplary embodiments.

Referring to FIG. 8, a barrier layer including third body portions 491, 492, 493, and 494 is disposed between first insulating layer 271 and second insulating layer 372 in regions overlapping second body portions 242A to 242D and first body portions 241A to 241B. Color filters 481, 482, and 483 are disposed in concave portions defined by first insulating layer 271 and at least third body portions 491 to 494. Second insulating layer 472 is disposed on color filters 481 to 483 and third body portions 491 to 494. A shape of second insulating layer 472 may vary depending on shapes of color filters 481 to 483 and third body portions 491 to 494.

According to one or more exemplary embodiments, third body portions 491 to 494 may be formed of any suitable material, such as, for instance, at least one of $SiN_x$, SiON, SiOx, and/or the like. Uppermost surfaces of third body portions 491 to 494 may have third heights H3 from thin film transistor substrate TFTSB. To this end, uppermost surfaces of color filters 481 to 483 may have fourth heights H4 from thin film transistor substrate TFTSB. Fourth heights H4 may be less than or equal to third heights H3.

As part of forming color filters 481 to 483, materials deposited to form color filters 481 to 483 may be filled to height H4, which may be may be greater than height H5 corresponding to an uppermost surface of first insulating layer 271. It is noted, however, that because height H5 is less than height H3, a potential for materials of color filters 481 to 483 being mixed can be reduced via third body portions 491 to 494.

According to one or more exemplary embodiments, third body portions 491 to 494 form concave portions with first insulating layer 271 that are deeper than corresponding concave portions formed in the display apparatus of FIG. 6. In this manner, third body portions 491 to 494 may have thicknesses THC in the third direction D3, which may be determined according to thickness variations associated with manufacturing tolerances of associated processes utilized to form color filters 481 to 483. It is noted that thickness THC may correspond to a maximum thickness of third body portions 491 to 494. Even though a height of uppermost surfaces of color filters 481 to 483 increases to be greater than height H5, third body portions 491 to 494 may prevent (or reduce the potential for) the materials of color filters 481 to 483 from being mixed with each other. In this manner, purity of color filters 481 to 483 may be maintained, and manufacturing yield may be improved.

Figure 9:
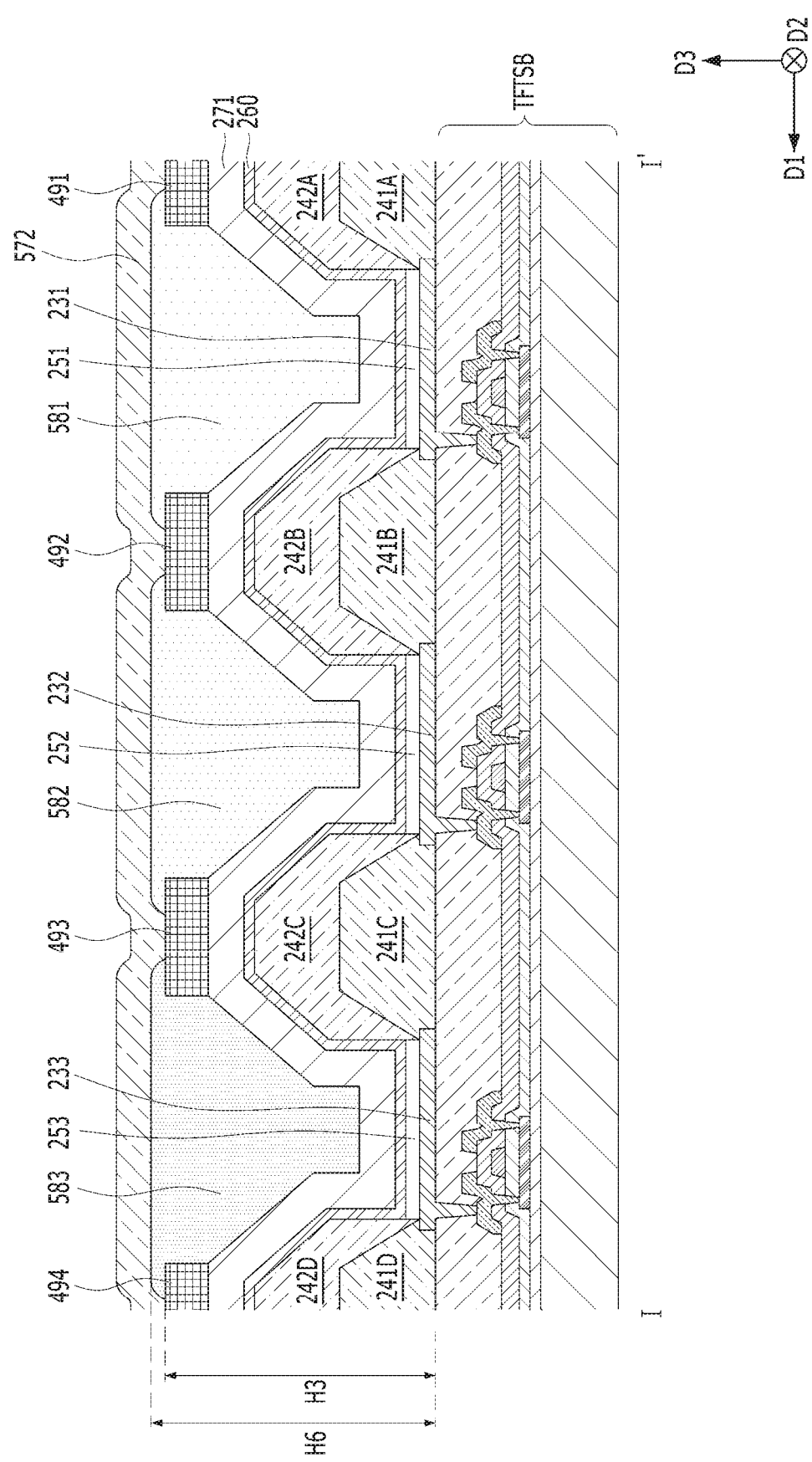
FIG. 9 is a cross-sectional view of the display apparatus of FIG. 1 taken along sectional line I-I', according to one or more exemplary embodiments.

FIG. 9 is a cross-sectional view of the display apparatus of FIG. 1 taken along sectional line I-I', according to one or more exemplary embodiments. Display apparatus 10 of FIG. 9 is similar to display apparatus 10 of FIGS. 3, 5, 6, and 8, and, as such, duplicative descriptions are primarily omitted to avoid obscuring exemplary embodiments.

Referring to FIG. 9, color filters 581, 582, and 583 are disposed in concave portions defined by first insulating layer 271 and third body portions 491 to 494. Second insulating layer 572 is disposed on color filters 581 to 583 and third body portions 491 to 494. It is noted that a shape of second insulating layer 572 may vary depending on shapes of color filters 581 to 583 and third body portions 491 to 494.

According to one or more exemplary embodiments, portions of color filters 581 to 583 may overlap third body portions 491 to 494. Top surfaces of color filters 581 to 583 may have sixth heights H6 that are greater than third heights H3 corresponding to heights of uppermost surfaces of third body portions 491 to 494. Although the heights of the uppermost surfaces of color filters 581 to 583 may increase as a result of manufacturing tolerances, third body portions 491 to 494 may still prevent (or reduce) materials for color filters 481 to 483 from being mixed. In this manner, purity of color filters 491 to 493 may be maintained, and manufacturing yield may be improved.

According to one or more exemplary embodiments, color filters may be disposed between stacked first body portions of the patterned layer and second body portions of the light-shielding layer. In this manner, a corresponding display apparatus may have reduced thickness, but also include color filters of sufficient thickness to improve display quality, as well as include sufficient levels of light-shielding features as previously described.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A display apparatus, comprising:
a substrate;
a patterned layer disposed on the substrate, the patterned layer comprising:
first body portions; and
a first opening disposed between the first body portions;
a light-shielding layer disposed on the patterned layer, the light-shielding layer comprising:
second body portions comprising at least one of black pigment and black dye; and
a second opening disposed between the second body portions;
a first electrode disposed on the substrate, the first opening and the second opening overlapping the first electrode;
a second electrode overlapping the first electrode, the second electrode disposed directly on a portion of the first body portions facing the first opening and a portion of the second body portions;
an electroluminescent layer disposed between the first electrode and the second electrode;
a first insulating layer disposed on the second electrode; and
a color filter disposed on the first insulating layer,
wherein:
the electroluminescent layer is at least disposed in the first opening; and
the first insulating layer and the color filter are at least disposed in the second opening.

2. The display apparatus of claim 1, wherein at least one of the color filter and the first insulating layer extends into the first opening.

3. The display apparatus of claim 1, further comprising:
a second insulating layer covering the first insulating layer and the color filter, wherein:
the first insulating layer covers the first body portions, the second body portions, and the second electrode; and
the color filter is disposed between the first insulating layer and the second insulating layer.

4. The display apparatus of claim 3, wherein the second insulating layer contacts the first insulating layer in regions overlapping the second body portions.

5. The display apparatus of claim 3, further comprising:
a barrier layer comprising:
third body portions; and
a third opening disposed between the third body portions,
wherein, in regions overlapping the second body portions, the third body portions are disposed between the second insulating layer and the first insulating layer.

6. The display apparatus of claim 5, wherein a first portion of the color filter extends into the third opening.

7. The display apparatus of claim 6, wherein second portions of the color filter overlap the third body portions.

8. The display apparatus of claim 5, wherein:
the barrier layer comprises:
a first surface disposed closer to the second insulating layer than the first insulating layer; and
a second surface opposing the first surface;
the color filter comprises:
a third surface disposed closer to the second insulating layer than the substrate; and
a fourth surface opposing the third surface; and
in a direction normal to the substrate, the first surface and the third surface are equidistant from the substrate or the third surface is closer to the substrate than the first surface.

9. The display apparatus of claim 5, wherein a maximum width of third opening is greater than a minimum width of the second opening.

10. The display apparatus of claim 5, wherein the third body portions comprise a lyophobic material resistive to a material of the color filter.

11. The display apparatus of claim 1, wherein:
the second body portions are disposed on the first body portions; and
the second body portions extend into the first opening.

12. The display apparatus of claim 1, wherein maximum widths of the second body portions are substantially equivalent to maximum widths of the first body portions.

13. The display apparatus of claim 1, wherein the color filter comprises particles suspended therein, the particles being configured to scatter incident light.

14. A display apparatus, comprising:
a first electrode;
a patterned layer comprising a first aperture exposing a portion of the first electrode;
a light-shielding layer disposed on the patterned layer, the light-shielding layer comprising a second aperture overlapping the first aperture;
an electroluminescent layer disposed in a portion of the first aperture;
a second electrode disposed in portions of the second aperture and the first aperture, the electroluminescent layer being stacked between the first electrode and the second electrode; and
a color filter extending into at least one of the second aperture and the first aperture,
wherein the light-shielding layer comprises at least one of black pigment and black dye,
wherein the second electrode is disposed directly on a portion of the light-shielding layer and a portion of the patterned layer facing the first aperture, and
wherein the second electrode overlaps the electroluminescent layer.

15. A method of manufacturing a display apparatus, the method comprising:
forming a patterned layer on a substrate comprising a first electrode, the patterned layer comprising a first aperture exposing a portion of the first electrode;
forming a light-shielding layer on the patterned layer, the light-shielding layer comprising a second aperture overlapping the first aperture;
depositing, through the second aperture, an electroluminescent material on the portion of first electrode;
forming a second electrode on the light-shielding layer, the patterned layer, and the electroluminescent material, the second electrode being disposed directly on a portion of the light-shielding layer and a portion of the patterned layer facing the first aperture, the second electrode extending at least into the second aperture; and
forming a color filter overlapping the electroluminescent material, the color filter extending at least into the second aperture,
wherein the light-shielding layer comprises at least one of black pigment and black dye.

16. The method of claim 15, wherein:
the patterned layer comprises a first surface disposed furthest from the substrate;

the color filter comprises a second surface disposed closest to the substrate; and the second surface is disposed closer to the substrate than the first surface.

17. The method of claim 15, further comprising:

forming, after forming the second electrode, a first insulating layer on the substrate, the first insulating layer extending at least into the second aperture, wherein the first insulating layer is disposed between the color filter and the second electrode.

18. The method of claim 17, further comprising:

forming, after forming the color filter, a second insulating layer on the substrate, wherein the color filter is disposed between the second insulating layer and the first insulating layer.

19. The method of claim 18, further comprising:

forming, before forming the color filter, a barrier layer comprising a third aperture overlapping the second aperture, wherein forming the color filter comprises depositing a color filter material through the third aperture.

20. The method of claim 19, wherein the barrier layer comprises a lyophobic material resistive to a material of the color filter.

* * * * *